US012757753B2

(12) United States Patent
Lim et al.

(10) Patent No.: US 12,757,753 B2
(45) Date of Patent: Oct. 6, 2026

(54) ELECTRONIC DEVICE WITH HIGH DRAFT ANGLE PACKAGE STRUCTURE

(71) Applicant: Texas Instruments Incorporated, Dallas, TX (US)

(72) Inventors: Wei Fen Sueann Lim, Melaka (MY); Jeevintharan A/L Sivasankaran, Negeri Sembilan (MY); Khair Khaizal, Seremban (MY); Edwin Jin Keong Lim, Kuala Lumpur (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 814 days.

(21) Appl. No.: 17/738,188

(22) Filed: May 6, 2022

(65) Prior Publication Data

US 2023/0361008 A1 Nov. 9, 2023

(51) Int. Cl.
*H10W 70/40* (2026.01)
*H10W 70/05* (2026.01)
(Continued)

(52) U.S. Cl.
CPC ....... *H10W 70/429* (2026.01); *H10W 70/093* (2026.01); *H10W 70/465* (2026.01); (Continued)

(58) Field of Classification Search
CPC ........... H01L 23/49555; H01L 21/4853; H01L 21/565; H01L 23/3114; H01L 23/4952; H01L 23/49524
See application file for complete search history.

(56) References Cited

U.S. PATENT DOCUMENTS 6,114,759 A * 9/2000 Okuaki ............. H01L 23/49555 257/692
2013/0127029 A1 5/2013 Lee et al.
(Continued)

FOREIGN PATENT DOCUMENTS

JP H06278168 A 10/1994
JP H10012771 A 1/1998
(Continued)

OTHER PUBLICATIONS

International Serach Report and Written Opinion dated Aug. 28, 2023, PCT Application No. PCT/US2023/020300, 13 pages.

*Primary Examiner* — Joshua Benitez Rosario
*Assistant Examiner* — Woo K Lee
(74) *Attorney, Agent, or Firm* — Ronald O. Neering; Frank D. Cimino

(57) ABSTRACT

An electronic device includes a molded package structure and a conductive lead partially exposed outside the package structure, the package structure having lateral sides extending at an angle that is greater than 15 degrees and 25 degrees or less to facilitate mold cavity filling during package molding and mitigate mold voids in the electronic device. A method of fabricating an electronic device includes attaching a die to a lead frame, electrically coupling a conductive terminal of the die to a conductive lead and performing a molding process using a mold having cavity sidewalls with a draft angle greater than 15 degrees and 25 degrees or less to form a package structure that encloses the die and partially encloses the conductive lead.

20 Claims, 6 Drawing Sheets

(51) Int. Cl.
*H10W 72/50* (2026.01)
*H10W 74/01* (2026.01)
*H10W 74/10* (2026.01)
*H10W 90/00* (2026.01)

(52) U.S. Cl.
CPC ....... *H10W 70/466* (2026.01); *H10W 74/016* (2026.01); *H10W 74/129* (2026.01); *H10W 72/536* (2026.01); *H10W 72/5445* (2026.01); *H10W 90/755* (2026.01)

(56) References Cited

U.S. PATENT DOCUMENTS

| | | | |
|---|---|---|---|
| 2014/0061682 | A1 | 3/2014 | Kobayashi |
| 2014/0191381 | A1 | 7/2014 | Lee et al. |
| 2015/0144389 | A1 | 5/2015 | Lee et al. |
| 2015/0214136 | A1 | 7/2015 | Lee et al. |
| 2016/0133617 | A1 | 5/2016 | Eugene Lee et al. |
| 2017/0213784 | A1 | 7/2017 | Lee et al. |
| 2017/0309595 | A1 | 10/2017 | Eugene Lee et al. |
| 2017/0345743 | A1 | 11/2017 | Lee et al. |
| 2018/0122724 | A1 | 5/2018 | Lee et al. |
| 2021/0384110 | A1 | 12/2021 | Lee et al. |

FOREIGN PATENT DOCUMENTS

| | | | | |
|---|---|---|---|---|
| JP | H11340257 | A | | 12/1999 |
| JP | 3708236 | B2 | * | 10/2005 |
| JP | 3958864 | B2 | * | 8/2007 |
| JP | 2018032879 | A | | 3/2018 |

* cited by examiner

ELECTRONIC DEVICE WITH HIGH DRAFT ANGLE PACKAGE STRUCTURE

BACKGROUND

Packaged electronic devices often include one or more semiconductor dies, conductive leads and electrical interconnections to form an electrical circuit which can be connected to conductive pads of a host printed circuit board. A package is molded to enclose the die and portions of the leads. Imbalanced flow of molding material can occur during the molding process, particularly for high voltage mold compound used to create tall packages. This can lead to incomplete filling during molding and create mold voids or gaps in the molded package structure. Mold voids can be addressed by mold parameter optimization, but this increases manufacturing cost and complexity.

SUMMARY

In one aspect, an electronic device includes a molded package structure and a conductive lead partially exposed outside the package structure. The package structure has lateral sides extending at an angle that is greater than 15 degrees and 25 degrees or less to facilitate mold cavity filling during package molding and mitigate mold voids in the electronic device.

In another aspect, a method of fabricating an electronic device includes attaching a die to a lead frame, electrically coupling a conductive terminal of the die to a conductive lead and performing a molding process using a mold having cavity sidewalls with a draft angle greater than 15 degrees and 25 degrees or less to form a package structure that encloses the die and partially encloses the conductive lead.

DETAILED DESCRIPTION

Figure 1:
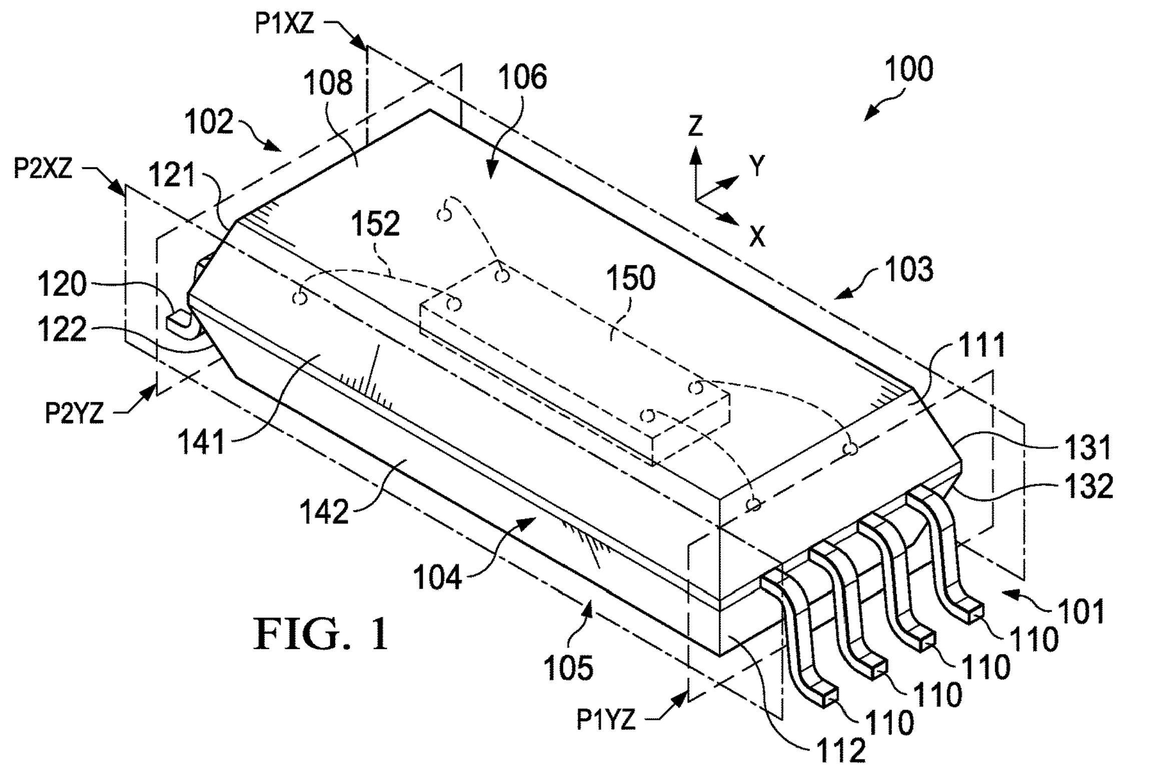
FIG. 1 is a perspective view of an electronic device with a molded package structure having high draft angle sidewalls and gullwing leads.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections.

Figure 1A:
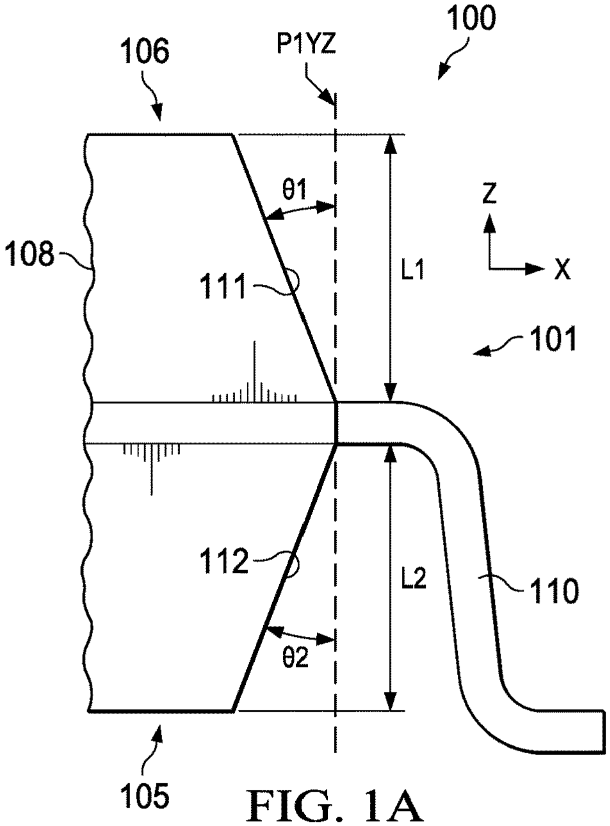
FIG. 1A is a partial side view of the electronic device of FIG. 1.
Figure 1B:
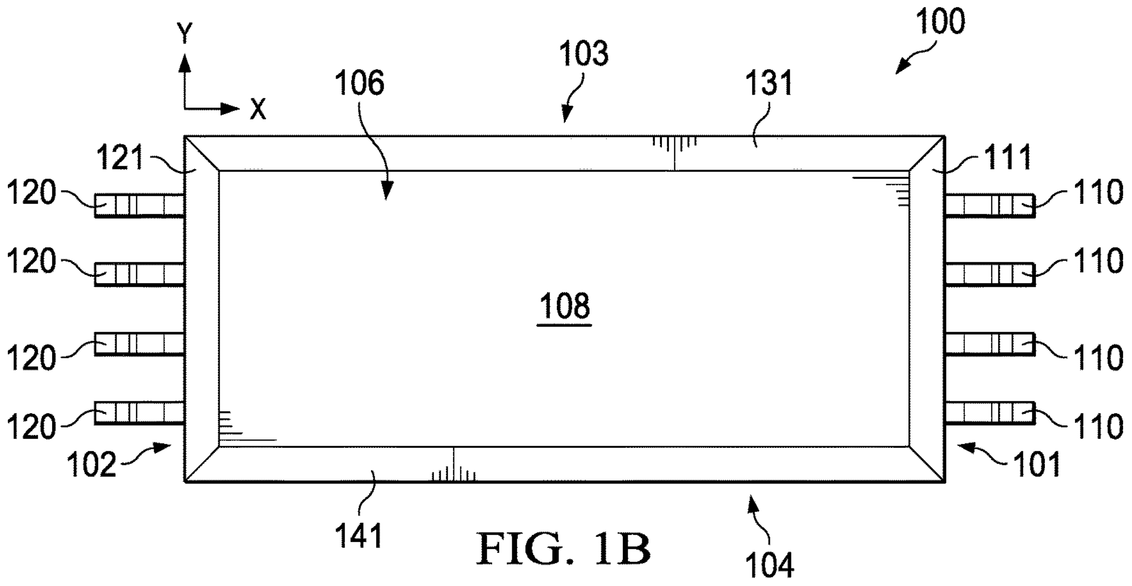
FIG. 1B is a top plan view of the electronic device of FIGS. 1 and 1A.
Figure 1C:
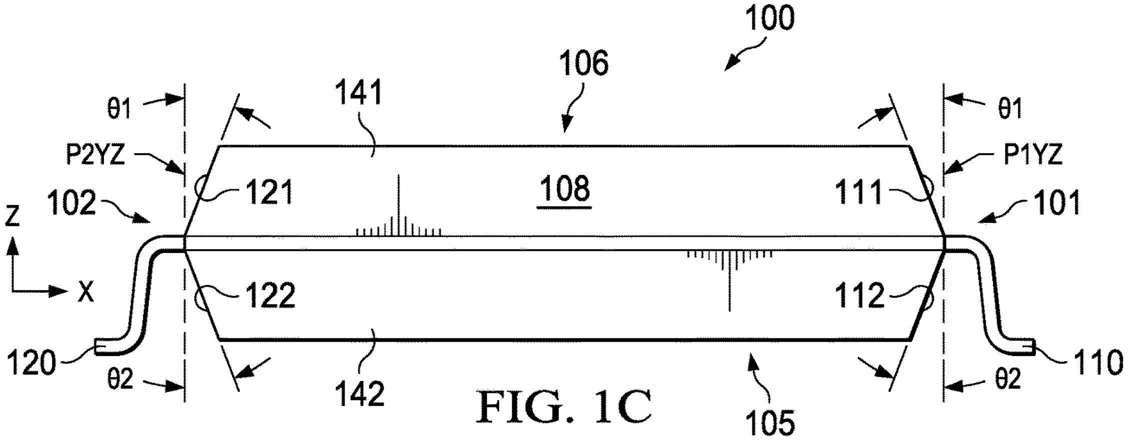
FIG. 1C is a front elevation view of the electronic device of FIGS. 1-1B.
Figure 1D:
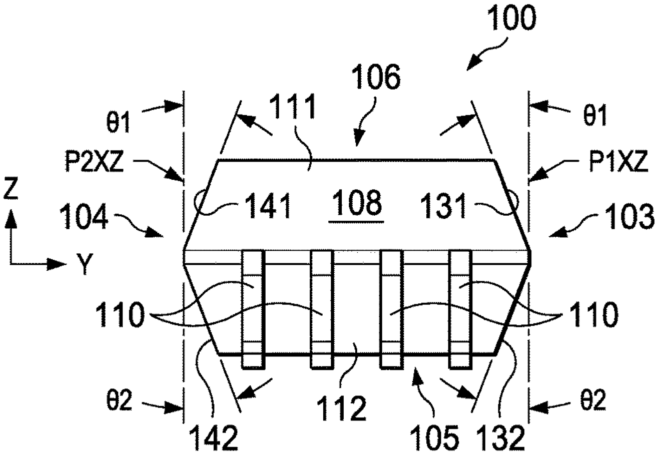
FIG. 1D is a side elevation view of the electronic device of FIGS. 1-1C.
Figure 2:
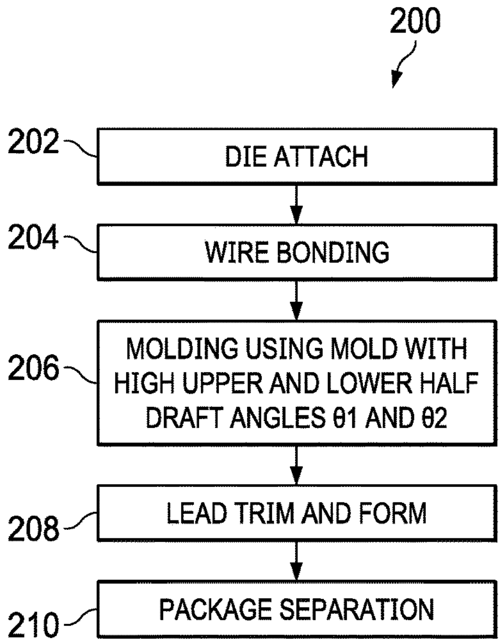
FIG. 2 is a flow diagram of a method of fabricating an electronic device.

Referring initially to FIGS. 1-1D, FIG. 1 shows an electronic device 100 with a molded package structure 108 having high draft angle sidewalls and gullwing leads. FIG. 1A shows a partial side view of the electronic device 100, FIG. 1B shows a top plan view of the electronic device 100, FIG. 1C shows a front elevation view of the electronic device 100, and FIG. 1D shows a side elevation view of the electronic device 100. The electronic device 100 is illustrated in an example position in a three-dimensional space with respective first, second, and third mutually orthogonal directions X, Y, and Z. As best shown in FIG. 1, the electronic device 100 includes opposite first and second sides 101 and 102 that extend along the second direction Y and are spaced apart from one another along the first direction X. The electronic device 100 also includes third and fourth sides 103 and 104 spaced apart from one another along the second direction Y, as well as a bottom side 105, and a top side 106 spaced apart from the bottom side 105 along the third direction Z. In the illustrated example, the bottom and top sides 105 and 106 are generally planar and extend in respective X-Y planes of the first and second directions X and Y. The electronic device 100 includes gullwing type conductive leads 110 along the first side 101, as well as leads 120 along the opposite second side 102. The example gullwing leads 110 and 120 are or include conductive metal, such as aluminum or copper, and have internal portions enclosed by the molded package structure 108 as well as external portions partially exposed outside the package structure 108.

As shown in FIGS. 1, 1A, and 1C, the lateral sides 101-104 of the package structure 108 have tapered portions that extend at an angle that is greater than 15 degrees and 25 degrees or less to facilitate mold cavity filling during package molding and mitigate mold voids in the electronic device. The tapered surfaces of the sides 101-104 are created by corresponding tapered walls of a mold cavity during molding to form the molded package structure 108 as illustrated and described further below. The first side 101 has an upper first portion 111 and a lower second portion 112. The first portion 111 of the first side 101 extends at a first angle θ1 from a first plane P1YZ of the respective second and third directions Y and Z to the sixth side 106. The second portion 112 of the first side 101 extends from the first plane P1YZ of the respective second and third directions Y and Z to the fifth side 105. In one example, the first angle θ1 is greater than 15 degrees, and the first angle θ1 is 25 degrees or less. In these or other examples, the second portion 112 of the first side 101 extends at a second angle θ2 from the first plane P1YZ of the respective second and third directions Y and Z to the fifth side 105. In one implementation, the second angle θ2 is greater than 15 degrees, and the second angle θ2 is 25 degrees or less. In one example, the first angle θ1 is approximately equal to the second angle θ2. In other implementations, the first angle θ1 and the second angle θ2 are different (e.g., FIGS. 12 and 13 below).

As shown in FIGS. 1 and 1C, the second side 102 has an upper first portion 121 and a lower second portion 122. The first portion 121 of the second side 102 extends at the first angle θ1 from a second Y-Z plane P2YZ of the respective second and third directions Y and Z to the sixth side 106. The second portion 122 of the second side 102 extends from the second Y-Z plane P2YZ to the fifth side 105. In one example, the second portion 122 of the second side 102 extends from the second Y-Z plane P2YZ the fifth side 105 at the second angle θ2.

As shown in FIGS. 1 and 1D, the third side 103 has an upper first portion 131 and a lower second portion 132. The first portion 131 of the third side 103 extends at the first angle θ1 from a first X-Z plane P1XZ of the respective first and third directions X and Z to the sixth side 106. The second portion 132 of the third side 103 extends from the first X-Z plane P1XZ to the fifth side 105. In one example, the second portion 132 of the third side 103 extends from the first X-Z plane P1XZ to the fifth side 105 at the second angle θ2. In this example, the fourth side 104 has a first portion 141 and a second portion 142. The first portion 141 of the fourth side 104 extends at the first angle θ1 from a second X-Z plane P2XZ of the respective first and third directions X and Z to the sixth side 106, and the second portion 142 of the fourth side 104 extends from the second X-Z plane P2XZ to the fifth side 105. In one example, the second portion 142 of the fourth side 104 extends from the second X-Z plane P2XZ to the fifth side 105 at the second angle θ2.

As shown in FIG. 1A, the first portions 111, 121, 131, and 141 of the respective first, second, third, and fourth sides 101, 102, 103, and 104 have a first height L1 along the third direction Z. The second portions 112, 122, 132, and 142 of the respective sides 101, 102, 103, and 104 have a second height L2 along the third direction Z. In the electronic device 100 of FIGS. 1-1D, the first height L1 and the second height L2 are approximately equal. In other examples (e.g., FIGS. 11 and 12 below), the first height L1 and the second height L2 are different. In the illustrated example, the side 101 includes a middle portion between the first portion 111 and the second portion 112, and the leads 110 extend outward from the middle portion of the first side 101 substantially laterally along the first direction X. The other lateral sides 102-104 in this example have similar middle portions. In other implementations (not shown), the middle portion is omitted from each of the lateral sides 101-104, for example, with the upper first portions 111, 121, 131, and 141 extending to the respective second portions 112, 122, 132, and 142.

As further shown in FIG. 1, the electronic device 100 includes a semiconductor die 150, for example, mounted on a die attach pad (not shown) and enclosed within the molded material of the package structure 108. The die 150 includes conductive terminals, such as conductive copper or aluminum die bond pads, some of which are electrically coupled by conductive bond wires 152 to respective ones of the conductive leads 110 or 120. Other examples include flip-chip die attach electrical connections alone or in combination with bond wires, substrate interconnections, and/or other forms of electrical coupling (not shown). The leads 110 and 120 in the example of FIGS. 1-1D are gullwing leads that extend outward from the respective first and second sides 101 102 of the package structure 108. In other examples, different lead types and/or shapes can be used, such as J-type leads (e.g., FIG. 9 below), no-lead types for quad flat no lead (QFN) package types (e.g., FIG. 10 below), etc. In various implementations, moreover, leads 110, 120 can be provided along one, two, three or four sides of the electronic device 100.

The electronic device provides increased angles θ1 and θ2 in excess of 15 degrees to facilitate balanced mold material flow within a mold cavity during molding processing to mitigate or avoid mold voids or gaps in the material of the finished molded package structure 108. This facilitates proper mechanical support and protection for the enclosed components as well as electrical isolation and high voltage withstand capabilities, particularly for high voltage isolated devices. In addition, the increased angles θ1 and θ2 facilitate uniform, void-free molding through enhanced mold material flow uniformity during mold fill operations without requiring adjustment or optimization of mold parameters, such as mold material temperature ranges, injection pressure and flow rates, mold material viscosity and other properties, etc. In certain examples, the electronic device can be a high voltage device with a tall profile, such as a 3.00 mm mold thickness along the third direction Z along with tapered side portions extending at the first and second angles θ1 and θ2 of more than 15 degrees. In certain examples, the angles θ1 and θ2 are 25 degrees or less, wherein angles above this amount can inhibit the electrical isolation spacing distance from high voltage components (e.g., die 150, bond wires 152) enclosed within the package structure 108 and external components or systems by reducing the thickness of the molded material of the package structure 108 near the respective sides 101-104. In certain examples, one or both of the angles θ1 and θ2 are 18 degrees or more and 22 degrees or less, such as approximately 20 degrees. The angles θ1 and θ2 in one implementation are set or controlled by the construction of respective mold halves or mold sections used in molding processing to create the molded package structure 108.

Figure 3:
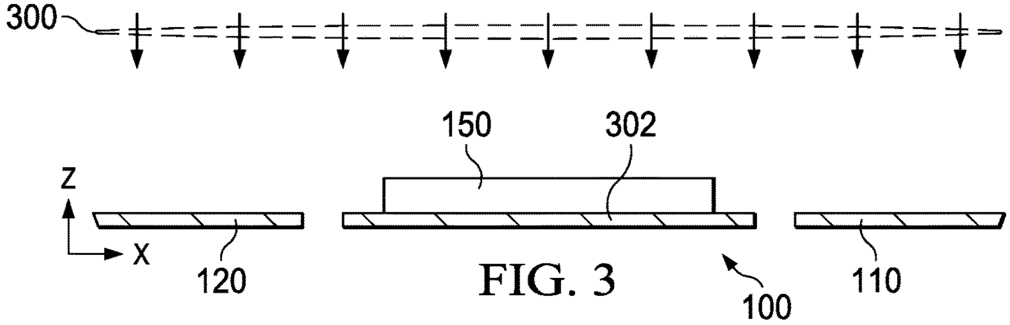
FIGS. 3-8 show the electronic device of FIGS. 1-1D undergoing fabrication processing according to the method of FIG. 2.

Referring now to FIGS. 2-8, FIG. 2 shows a method 200 of fabricating an electronic device, and FIGS. 3-8 show the electronic device 100 of FIGS. 1-1D undergoing fabrication processing according to the method 200. The method 200 includes die attach processing at 202. FIG. 3 shows one example, in which a die attach process 300 is performed that attaches the semiconductor die 150 to a die attach pad 302 of a starting lead frame that also includes the prospective leads 110 and 120. In one example, the starting lead frame has multiple prospective device sections arranged in an array of rows and columns (not shown), the die attach process 300 includes concurrent or sequential placement of multiple dies 150 to respective die attach pads of the panel array.

Figure 4:
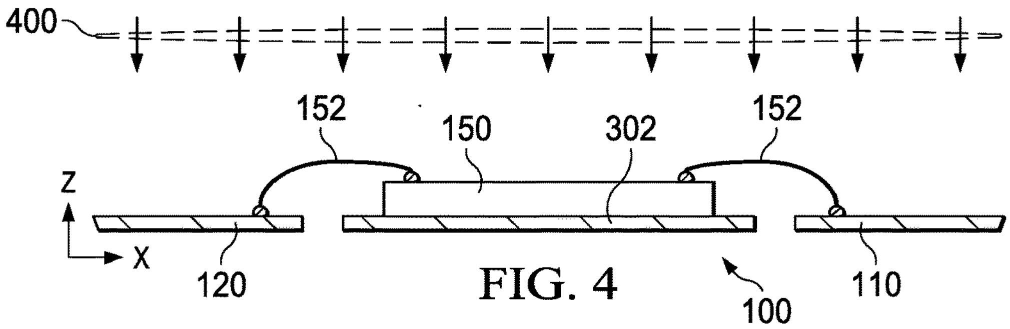
Figure 5:
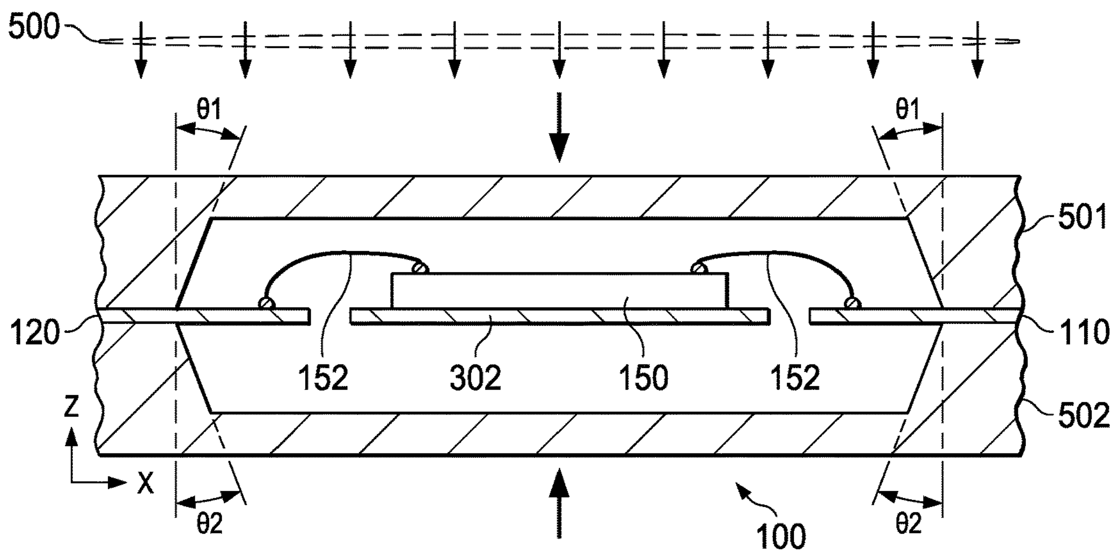

The method 200 continues at 204 with electrical coupling including coupling one or more conductive terminals of the die 150 to respective conductive leads 110 or 120, as well as any die-to-die connections required for a given electronic device design (e.g., die-to-die connections for a multiple chip module or MCM device, not shown). FIG. 4 shows one example, in which a wire bonding process 400 is performed that forms bond wires 152 between respective conductive bond pads of the semiconductor die 150 and associated ones of the conductive leads 110, 120 of the starting lead frame.

Figure 6:
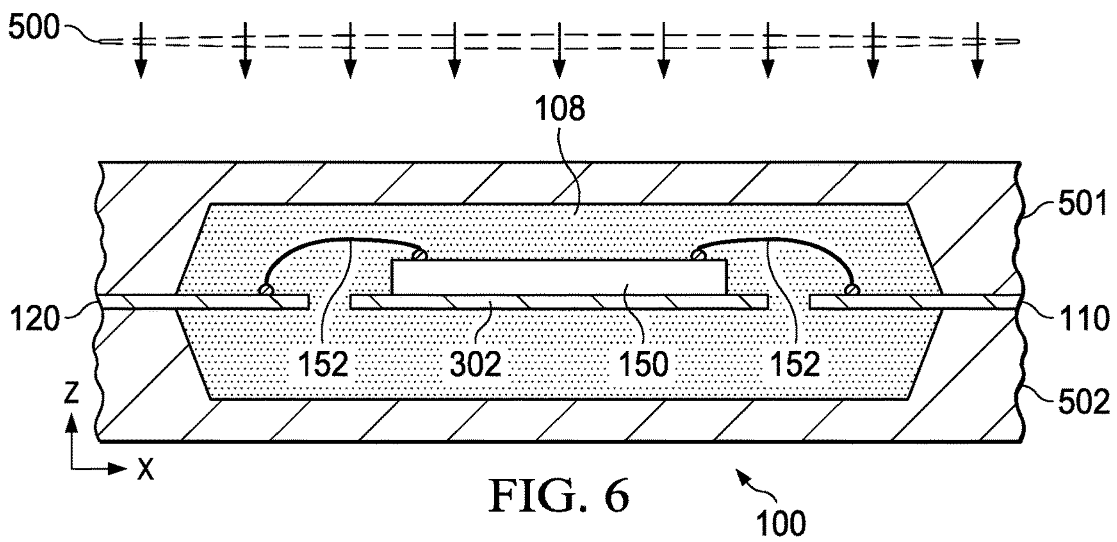
Figure 7:
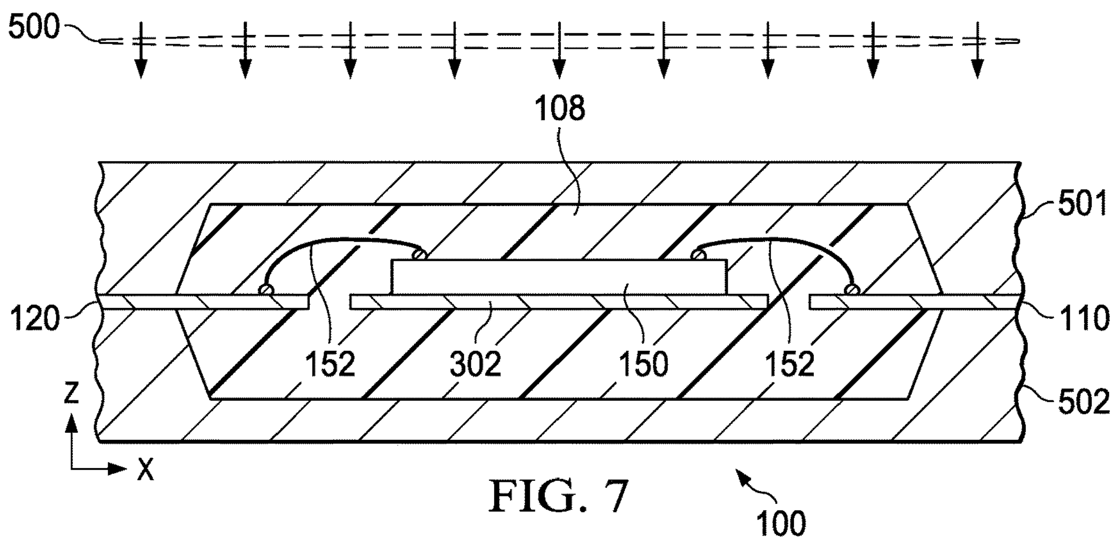
Figure 8:
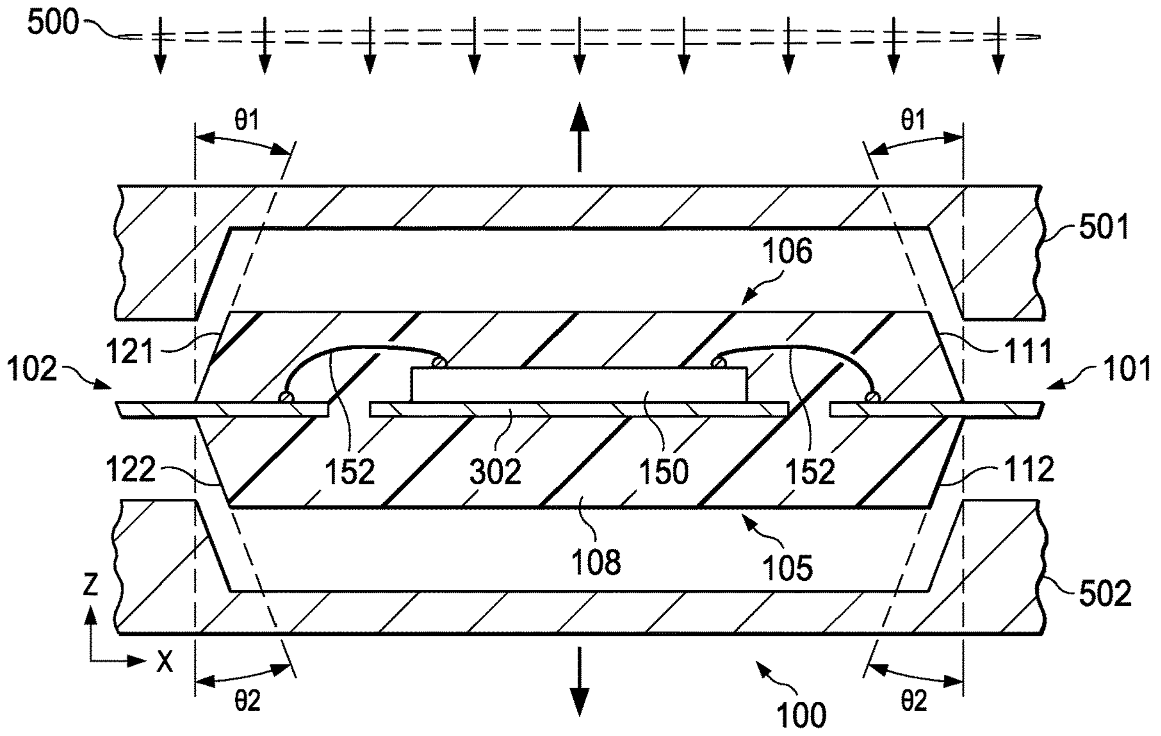

The method 200 further includes molding at 206 using a mold with high upper and lower draft angles. FIGS. 5-8 show one example of the electronic device 100 undergoing a molding process 500 using a mold with separable first and second mold sections 501 and 502, respectively. The first mold section 501 in the example of FIGS. 5-8 has a first (e.g., upper) cavity with a first draft angle θ1, and the second mold section 502 has a second (e.g., lower) cavity with a second draft angle θ2. The draft angles θ1 and θ2 in one example are both greater than 15 degrees and 25 degrees or less, such as 18 to 22 degrees in one implementation. The mold cavity interior sidewall draft angles θ1 and θ2 approximately correspond to the respective first and second angles θ1 and θ2 of the electronic device 100 after molding. The molding process 500 forms the package structure 108 that encloses the die 150 and the bond wires 152 and partially encloses the conductive lead 110 and 120, leaving outer portions thereof exposed for subsequent trim and form operations. The upper and lower mold sections 501 and 502 are closed along the directions of the arrows in FIG. 5 to surround the die 150 and the prospective device section of the lead frame panel array to create a cavity associated with each prospective electronic device. The cavity for each device is then filled with molten molding compound 108 as shown in FIG. 6 and the molding compound solidifies as it cools as shown in FIG. 7. The mold sections 501 and 502 are then separated along the directions of the arrows in FIG. 8, leaving the molded package structure 108 having the side portions at the angles θ1 and θ2 as described above in connection with FIGS. 1-1D. The method 200 continues at 208 in FIG. 2 with lead trimming and forming processing (not shown), as well as package separation at 210 to provide individual finished packaged electronic devices 100.

Figure 9:
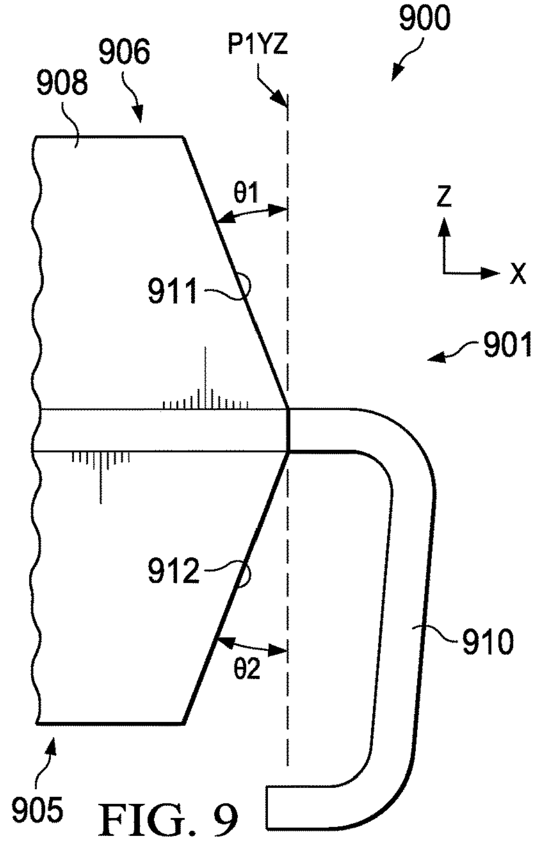
FIG. 9 is a partial side view another electronic device having J-type leads.

FIGS. 9-13 show further example electronic devices having molded package structures with sidewall angles of more than 15 degrees and 25 degrees or less. FIG. 9 shows a portion of another electronic device 900 having a molded packaged structure 908 with J-type leads 910 along a first side 901 that has a first (e.g., upper) portion 911 extending at the first angle θ1 to the top (e.g., sixth) side 906 and a second (e.g., lower) portion 912 extending to the bottom (e.g., fifth) side 905 at the second angle θ2. The other three lateral sides have similar first and second portions at the respective angles θ1 and θ2. In one example, the electronic device 900 has four lateral sides including the illustrated side 901, and each of the four sides includes one or more conductive leads 910 partially exposed along the respective sides as well as being partially exposed along the bottom (e.g., fifth) side 905 of the package structure 908. In another example, the electronic device 900 has leads along fewer than all the lateral sides.

Figure 10:
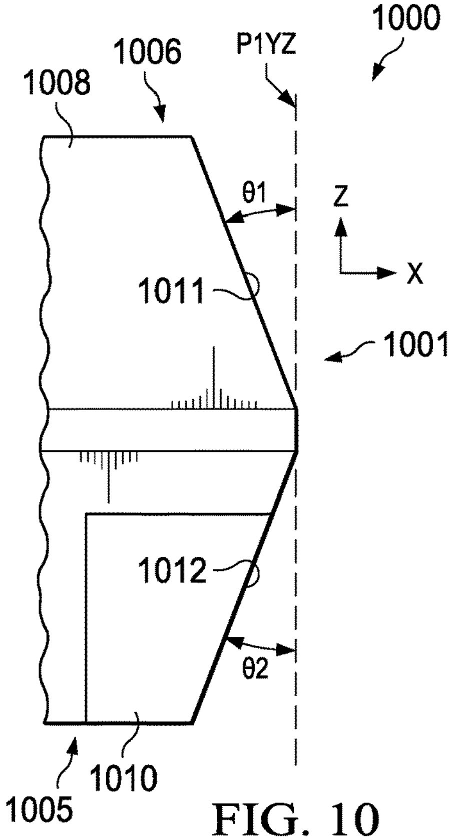
FIG. 10 is a partial side view a quad flat no lead (QFN) electronic device having a molded package structure with high draft angle sidewalls.

FIG. 10 shows a portion of another electronic device 1000 having a quad flat molded (e.g., QFN) packaged structure 1008 with partially exposed leads 1010 along a first side 1001 that has a first (e.g., upper) portion 1011 extending at the first angle θ1 to the top (e.g., sixth) side 1006 and a second (e.g., lower) portion 1012 extending to the bottom (e.g., fifth) side 1005 at the second angle θ2. The other three lateral sides have similar first and second portions at the respective angles θ1 and θ2. In one example, the electronic device 1000 has four lateral sides including the illustrated side 1001, and each of the four sides includes one or more conductive leads 1010 partially exposed along the respective sides as well as being partially exposed along the bottom (e.g., fifth) side 1005 of the package structure 1008. In another example, the electronic device 1000 has leads along fewer than all the lateral sides.

Figure 11:
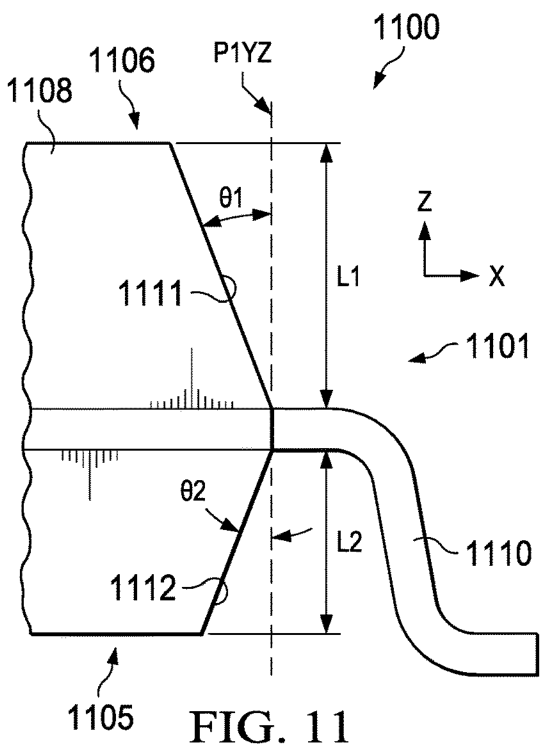
FIG. 11 is a partial side view another electronic device having a molded package structure with unequal height upper and lower side portions.

FIG. 11 shows a portion of another electronic device 1100 having a molded packaged structure 1108 with gullwing leads 1110 along a first side 1101 that has a first (e.g., upper) portion 1111 extending at the first angle θ1 to the top (e.g., sixth) side 1106 and a second (e.g., lower) portion 1112 extending to the bottom (e.g., fifth) side 1105 at the second angle θ2. In this example, the first portion 1111 of the first side 1101 has a first height L1 along the third direction Z and the second portion 1112 has a second height L2 along the third direction Z, and the first height L1 and the second height L2 are different. In the illustrated implementation, the second height L2 is less than the first height L1. In another example, the second height L2 is greater than the first height L1. In these examples, the other three lateral sides have similar first and second portions at the respective angles θ1 and θ2. In one example, the electronic device 1100 has four lateral sides including the illustrated side 1101, and each of the four sides includes one or more gullwing type conductive leads 1110 extending out of the respective sides. In another example, the electronic device 1100 has leads 1110 along fewer than all the lateral sides. In the example of FIG. 11, moreover, the first and second angles θ1 and θ2 are different and both the angles θ1 and θ2 are greater than 15 degrees and 25 degrees or less. In the illustrated implementation, the angle θ1 is less than the angle θ2. In another implementation, the angle θ1 is greater than the angle θ2.

Figure 12:
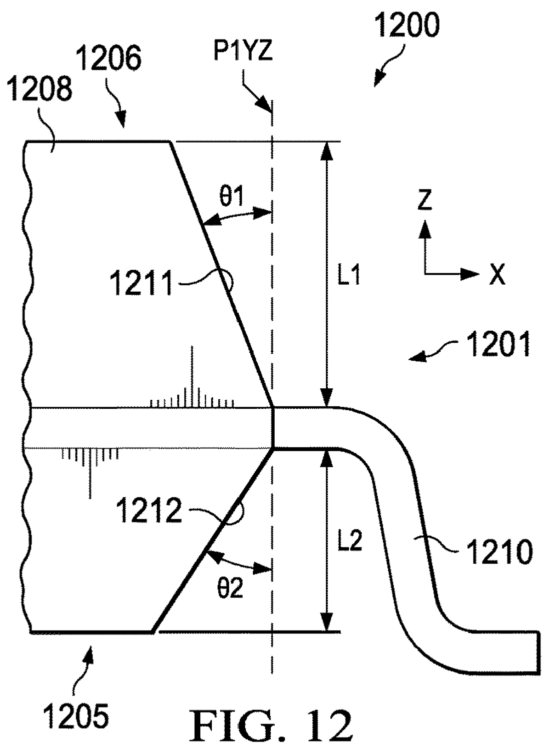
FIG. 12 is a partial side view another electronic device having a molded package structure with unequal height upper and lower side portions at different draft angles.

FIG. 12 shows a portion of another electronic device 1200 with upper and lower side portions at different draft angles. The electronic device 1200 has a molded packaged structure 1208 with gullwing leads 1210 along a first side 1201 that has a first (e.g., upper) portion 1211 extending at the first angle θ1 to the top (e.g., sixth) side 1206 and a second (e.g., lower) portion 1212 extending to the bottom (e.g., fifth) side 1205 at the second angle θ2. In this example, the first portion 1211 of the first side 1201 has a first height L1 along the third direction Z and the second portion 1212 has a second height L2 along the third direction Z, and the first height L1 and the second height L2 are different. In the illustrated implementation, the second height L2 is less than the first height L1. In another example, the second height L2 is greater than the first height L1. In these examples, the other three lateral sides have similar first and second portions at the respective angles θ1 and θ2. In one example, the electronic device 1200 has four lateral sides including the illustrated side 1201, and each of the four sides includes one or more gullwing type conductive leads 1210 extending out of the respective sides. In another example, the electronic device 1200 has leads 1210 along fewer than all the lateral sides. In the example of FIG. 12, moreover, the first and second angles θ1 and θ2 are different and both the angles θ1 and θ2 are greater than 15 degrees and 25 degrees or less. In the illustrated implementation, the angle θ1 is less than the angle θ2. In another implementation, the angle θ1 is greater than the angle θ2.

Figure 13:
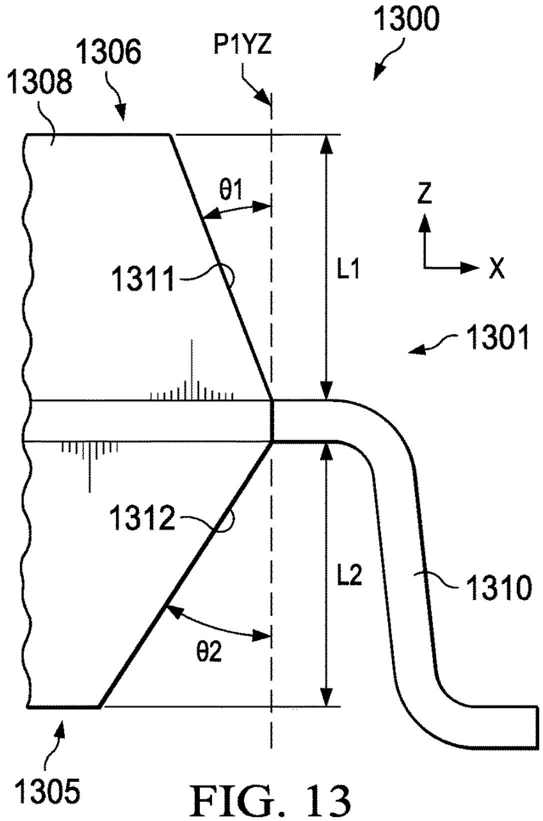
FIG. 13 is a partial side view another electronic device having a molded package structure with upper and lower side portions at different draft angles.

FIG. 13 shows another example electronic device 1300 having a molded package structure 1308 with upper and lower side portions 1311 and 1312 at different draft angles. The electronic device 1300 has gullwing leads 1310 along a first side 1301 that has a first (e.g., upper) portion 1311 extending at the first angle θ1 to the top (e.g., sixth) side 1306 and a second (e.g., lower) portion 1312 extending to the bottom (e.g., fifth) side 1305 at the second angle θ2. In this example, the first portion 1311 of the first side 1301 has a first height L1 along the third direction Z and the second portion 1312 has a second height L2 along the third direction Z, and the first height L1 and the second height L2 are approximately equal. In this example, the other three lateral sides have similar first and second portions at the respective angles θ1 and θ2. In one example, the electronic device 1300 has four lateral sides including the illustrated side 1301, and each of the four sides includes one or more gullwing type conductive leads 1310 extending out of the respective sides. In another example, the electronic device 1300 has leads 1310 along fewer than all the lateral sides. In the example of FIG. 13, moreover, the first and second angles θ1 and θ2 are different and both the angles θ1 and θ2 are greater than 15 degrees and 25 degrees or less. In the illustrated implementation, the angle θ1 is less than the angle θ2. In another implementation, the angle θ1 is greater than the angle θ2.

The described examples and variants thereof provide advantages with respect to facilitating complete mold fill and mitigating mold voids or gaps to enhance the performance and rigidity of the molded package structure. These examples allow the use of normal molding parameter control with or without the added expense and complexity of mold parameter optimization. These solutions provide advantages, such as for multi-chip-module (MCM) packaged devices and packaged integrated circuits generally with enhanced mold material flow during manufacturing of single component packaged electronic devices as well as packaged integrated circuits with multiple electronic components. In addition, the described solutions provide advantages for thick package designs, including devices having package structure thicknesses (e.g., along the example third direction (Z) of 3.00 mm or more. Certain implementations of the described examples can mitigate mold flow imbalance with high voltage mold compound by mold modification to implement new package draft angle designs with draft angles greater than 15 degrees and 25 degrees or less. These examples also save production cost by minimizing yield lost due to external mold voids and increase productivity by avoiding machine downtime due to mold voids without requiring further mold process optimization and eliminating multiple learning cycles on mold flow/parameter optimization.

The above examples are merely illustrative of several possible implementations of various aspects of the present disclosure, wherein equivalent alterations and/or modifications will occur to others skilled in the art upon reading and understanding this specification and the annexed drawings. Unless otherwise stated, "about," "approximately," or "substantially" preceding a value means +/−10 percent of the stated value. Modifications are possible in the described examples, and other implementations are possible, within the scope of the claims.

What is claimed is:

1. An electronic device, comprising:

a package structure having a first side, a second side, a third side, a fourth side, a fifth side, and a sixth side, the first and second sides spaced apart from one another along a first direction, the third and fourth sides spaced apart from one another along a second direction that is orthogonal to the first direction, the fifth and sixth sides spaced apart from one another along a third direction that is orthogonal to the first and second directions; and a conductive lead partially exposed outside the package structure;

the first side having a first portion and a second portion, the first portion of the first side extending at a first angle from a first plane of the second and third directions to the sixth side, the second portion of the first side extending from the first plane of the second and third directions to the fifth side, the first angle being greater than 15 degrees, and the first angle being 25 degrees or less;

the second side having a first portion and a second portion, the first portion of the second side extending at the first angle from a second plane of the second and third directions to the sixth side, and the second portion of the second side extending from the second plane of the second and third directions to the fifth side;

the third side having a first portion and a second portion, the first portion of the third side extending at the first angle from a first plane of the first and third directions to the sixth side, and the second portion of the third side extending from the first plane of the first and third directions to the fifth side; and the fourth side having a first portion and a second portion, the first portion of the fourth side extending at the first angle from a second plane of the first and third directions to the sixth side, and the second portion of the fourth side extending from the second plane of the first and third directions to the fifth side.

2. The electronic device of claim 1, wherein:

the second portion of the first side extends at a second angle from the first plane of the second and third directions to the fifth side;

the second portion of the second side extends at the second angle from the second plane of the second and third directions to the fifth side;

the second portion of the third side extends at the second angle from the first plane of the first and third directions to the fifth side;

the second portion of the fourth side extends at the second angle from the second plane of the first and third directions to the fifth side;

the second angle is greater than 15 degrees; and the second angle is 25 degrees or less.

3. The electronic device of claim 2, wherein the first angle is approximately equal to the second angle.

4. The electronic device of claim 3, wherein the conductive lead extends outward from the first side of the package structure.

5. The electronic device of claim 3, wherein the conductive lead is partially exposed along the first side and the fifth side of the package structure.

6. The electronic device of claim 2, wherein the conductive lead extends outward from the first side of the package structure.

7. The electronic device of claim 2, wherein the conductive lead is partially exposed along the first side and the fifth side of the package structure.

8. The electronic device of claim 2, wherein:

the first angle is 18 degrees or more;

the first angle is 22 degrees or less;

the second angle is 18 degrees or more; and the second angle is 22 degrees or less.

9. The electronic device of claim 1, wherein the conductive lead extends outward from the first side of the package structure.

10. The electronic device of claim 1, wherein the conductive lead is partially exposed along the first side and the fifth side of the package structure.

11. The electronic device of claim 1, wherein:

the first angle is 18 degrees or more;

the first angle is 22 degrees or less;

the second angle is 18 degrees or more; and the second angle is 22 degrees or less.

12. The electronic device of claim 1, wherein:

the first portions of the respective first, second, third, and fourth sides have a first height along the third direction;

the second portions of the respective first, second, third, and fourth sides have a second height along the third direction; and the first height and the second height are different.

13. The electronic device of claim 12, wherein:

the second portion of the first side extends at a second angle from the first plane of the second and third directions to the fifth side;

the second portion of the second side extends at the second angle from the second plane of the second and third directions to the fifth side;

the second portion of the third side extends at the second angle from the first plane of the first and third directions to the fifth side;
the second portion of the fourth side extends at the second angle from the second plane of the first and third directions to the fifth side; and
the first angle and the second angle are different.

14. The electronic device of claim 1, wherein:
the second portion of the first side extends at a second angle from the first plane of the second and third directions to the fifth side;
the second portion of the second side extends at the second angle from the second plane of the second and third directions to the fifth side;
the second portion of the third side extends at the second angle from the first plane of the first and third directions to the fifth side;
the second portion of the fourth side extends at the second angle from the second plane of the first and third directions to the fifth side; and
the first angle and the second angle are different.

15. The electronic device of claim 14, wherein:
the first portions of the respective first, second, third, and fourth sides have a first height along the third direction;
the second portions of the respective first, second, third, and fourth sides have a second height along the third direction; and
the first height is approximately equal to the second height.

16. A method of fabricating an electronic device, the method comprising:
attaching a die to a lead frame;
electrically coupling a conductive terminal of the die to a conductive lead; and
performing a molding process using a mold having cavity sidewalls with a draft angle greater than 15 degrees and 25 degrees or less to form a package structure that encloses the die and partially encloses the conductive lead.

17. The method of claim 16, wherein the draft angle is 18 degrees or more and 22 degrees or less.

18. The method of claim 16, wherein:
the mold includes separable first and second mold sections;
the first mold section has a first cavity with the draft angle; and
the second mold section has a second cavity with a second draft angle.

19. The method of claim 18, wherein the draft angle is approximately equal to the second draft angle.

20. The method of claim 18, wherein:
the draft angle is 18 degrees or more;
the draft angle is 22 degrees or less;
the second draft angle is 18 degrees or more; and
the second draft angle is 22 degrees or less.

* * * * *